(12) United States Patent
Kato et al.

(10) Patent No.: US 8,680,633 B1
(45) Date of Patent: Mar. 25, 2014

(54) MAGNETORESISTIVE ELEMENT AND MAGNETIC MEMORY

(71) Applicants: Kabushiki Kaisha Toshiba, Tokyo (JP); Tohoku University, Sendai (JP)

(72) Inventors: Yushi Kato, Tokyo (JP); Tadaomi Daibou, Yokohama (JP); Eiji Kitagawa, Yokohama (JP); Takao Ochiai, Funabashi (JP); Takahide Kubota, Sendai (JP); Shigemi Mizukami, Sendai (JP); Terunobu Miyazaki, Sendai (JP)

(73) Assignees: Kabushiki Kaisha Toshiba, Tokyo (JP); Tohoku University, Sendai-shi (JP)

( * ) Notice: Subject to any disclaimer, the term of this patent is extended or adjusted under 35 U.S.C. 154(b) by 0 days.

(21) Appl. No.: 13/826,408

(22) Filed: Mar. 14, 2013

(30) Foreign Application Priority Data

Sep. 21, 2012 (JP) .................................. 2012-208293

(51) Int. Cl.
*H01L 27/105* (2006.01)

(52) U.S. Cl.
USPC ........................................ 257/425; 257/421

(58) Field of Classification Search
USPC ................................. 257/425, 421
See application file for complete search history.

(56) References Cited

U.S. PATENT DOCUMENTS

| | | | |
|---|---|---|---|
| 6,934,133 B2 * | 8/2005 | Hayakawa et al. ........ | 360/324.2 |
| 7,663,197 B2 | 2/2010 | Yoshikawa et al. | |
| 2007/0096229 A1 | 5/2007 | Yoshikawa et al. | |
| 2013/0010532 A1 | 1/2013 | Nagase et al. | |

FOREIGN PATENT DOCUMENTS

| | | |
|---|---|---|
| JP | 57-39151 | 3/1982 |
| JP | 2003-163392 | 6/2003 |
| JP | 2005-203535 | 7/2005 |
| JP | 2009-239121 | 10/2009 |
| JP | 2011-119755 | 6/2011 |
| JP | 2013-16645 | 1/2013 |

OTHER PUBLICATIONS

U.S. Appl. No. 13/623,405, filed Sep. 20, 2012, Yushi Kato et al.
U.S. Appl. No. 13/623,306, filed Sep. 20, 2012, Chikayoshi Kamata et al.
H. Kurt et al. "Magnetic and electronic properties of $D0_{22-Mn_3}Ge$ (001) films", Applied Physics Letters 101, 2012, pp. 1-3.
Tetuo Ohoyaama et al. "A new phase of an Intermetallic compound $Mn_{3.4}Ge$ and its Magnetism", Short Notes vol. 16, pp. 352-353.
T. Matsui et al. "Formation of unknown magnetic phase by solid state reaction of thin multilayered films of 75 at %Mn-25 at %Ge", Journal of Magnetism and Magnetic Materials 192, 1999, pp. 247-252.
Dang Duc Dung et al. "Magnetism and transport properties of α-Mn structure Mn3Ge thin film", Journal of Applied Physics 109, 2011, pp. 1-3.
N. Pinto et al. "Growth and magnetic properties of MnGe films for spintronic application", Journal of Materials Science: Materials in Electronics 14, 2003, pp. 337-340.
Office Action issued on Nov. 12, 2013, in Japanese Application No. 2012-208293.

* cited by examiner

*Primary Examiner* — Roy Potter
(74) *Attorney, Agent, or Firm* — Oblon, Spivak, McClelland, Maier & Neustadt, L.L.P.

(57) ABSTRACT

A magnetoresistive element according to an embodiment includes a first magnetic layer, a second magnetic layer, and a first nonmagnetic layer provided between the first magnetic layer and the second magnetic layer, the first magnetic layer including a magnetic film of $Mn_xGe_y$ (77 atm %≤x≤82 atm %, 18 atm %≤y≤23 atm %, x+y=100 atm %).

18 Claims, 11 Drawing Sheets

US 8,680,633 B1

MAGNETORESISTIVE ELEMENT AND MAGNETIC MEMORY

CROSS REFERENCE TO RELATED APPLICATIONS

This application is based upon and claims the benefit of priority from the prior Japanese Patent Application No. 2012-208293, filed on Sep. 21, 2012, the entire contents of which are incorporated herein by reference.

FIELD

Embodiments described herein relate generally to magnetoresistive elements and magnetic memories.

BACKGROUND

A basic structure of a magnetic tunnel junction (MTJ) element serving as a magnetoresistive element is a stacked structure including a storage layer, the magnetization direction of which is changeable, a reference layer, the magnetization direction of which is fixed, and an insulating layer provided between the storage layer and the reference layer. It is known that an MTJ element shows a tunneling magnetoresistive (TMR) effect. Thus, an MTJ element is used as a storage element of a memory cell in a magnetic random access memory (MRAM).

An MRAM stores information ("1", "0") in accordance with a change in relative angle between magnetizations of magnetic layers included in an MTJ element, and is nonvolatile. Since the magnetization switching speed of an MRAM is a few nanoseconds, it is possible to write and read data at a high speed with an MRAM. Accordingly, MRAMs are expected to be next-generation hig h-speed nonvolatile memories. Furthermore, by using a method called "spin transfer torque switching" for controlling magnetization by means of a spin polarized current, a current density can be increased by decreasing the cell size of an MRAM. Accordingly, it is possible to easily switch the magnetization in a storage layer, resulting in that it is possible to obtain an MRAM with a high density and a low power consumption.

In improving the density of a nonvolatile memory, it is essential to improve the degree of integration of a magnetoresistive element. However, as the size of a magnetoresistive element decreases, the thermal stability of a ferromagnetic material for forming the magnetoresistive element deteriorates. Therefore, a problem arises in that the magnetic anisotropy energy and the thermal stability of the ferromagnetic material should be improved.

In order to solve this problem, recently, it is attempted that an MRAM using a perpendicular magnetization MTJ element, in which the direction of the magnetization of a ferromagnetic material is perpendicular to the film plane, be formed. In a perpendicular magnetization MTJ element, generally a ferromagnetic material with a high magnetic crystalline anisotropy is used.

Generally, a critical current for magnetization reversal by the spin transfer torque switching method is dependent on the saturation magnetization and the Gilbert damping constant of a storage layer. Accordingly, in order to switch the magnetization of a storage layer by means of low-current spin transfer torque switching, it is necessary to reduce the saturation magnetization and the Gilbert damping constant of the storage layer. Furthermore, the influence of strayed magnetic field from a reference layer becomes more remarkable as the element is miniaturized. Accordingly, in order to improve the degree of integration of a magnetoresistive element, it is also necessary to reduce the saturation magnetization of the reference layer thereof with a high magnetic anisotropy energy of the reference layer being maintained.

DETAILED DESCRIPTION

Figure 1:
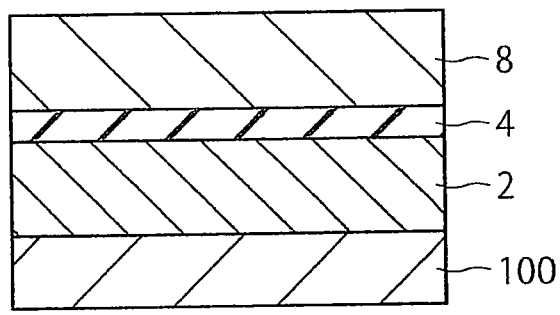
FIG. 1 is a sectional view showing a magnetoresistive element according to a first embodiment.

A magnetoresistive element according to an embodiment includes a first magnetic layer, a second magnetic layer, and a first nonmagnetic layer provided between the first magnetic layer and the second magnetic layer, the first magnetic layer including a magnetic film of $Mn_xGe_y$ (77 atm %≤x≤82 atm %, 18 atm %≤y≤23 atm %, x+y=100 atm %).

Hereinafter, embodiments will be explained with reference to the accompanying drawings. In the following explanations, elements having the same function and the same structure are denoted by the same reference numeral, and a repeated explanation will be performed only when it is necessary to do so.

First Embodiment

FIG. 1 shows a magnetoresistive element according to a first embodiment. FIG. 1 is a sectional view of the magnetoresistive element 1 of the first embodiment. The magnetoresistive element 1 of this embodiment is an MTJ element having such a structure that a ferromagnetic layer 2, a nonmagnetic layer 4 (hereinafter also referred to as "tunnel barrier layer 4"), and a ferromagnetic layer 8 are formed on a base layer 100 in this order. The base layer 100 is used to control the crystallinity such as crystal orientation, crystal grain size, etc. of the ferromagnetic layer 2 and the layers above the ferromagnetic layer 2, and the detailed explanation thereof will be provided later. One of the ferromagnetic layer 2 and the ferromagnetic layer 8 includes a magnetic film of $Mn_xGe_y$ (77 atm %≤x≤82 atm %, 18 atm %≤y≤23 atm %, x+y=100 atm %).

The resistance value of the MTJ element is determined by the angle between the directions of the magnetizations of the two magnetic layers arranged with the tunnel barrier layer sandwiched therebetween. It is possible to control the angle between the directions of the magnetizations by means of an external magnetic field or current caused to flow through the element. On such an occasion, it is possible to control the angle between the directions of the magnetizations more stably by differentiating the magnitudes of coercive force, anisotropic magnetic field Hk and/or Gilbert damping constant α of the two magnetic layers. Herein, the magnetic layer with a higher coercive force, a higher anisotropic magnetic field Hk or a higher Gilbert damping constant α will be called "reference layer," and a magnetic layer with a lower coercive force, a lower anisotropic magnetic field Hk or a lower Gilbert damping constant α will be called "storage layer." Generally, it is desirable that a magnetic layer with a higher coercive force, a higher anisotropic magnetic field Hk or a higher Gilbert damping constant α be used as a reference layer, and a magnetic layer with a lower coercive force, a lower anisotropic magnetic field Hk or a lower Gilbert damping constant α be used as a storage layer. As will be described later, since a magnetic layer of $Mn_xGe_y$ (77 atm %≤x≤82 atm %, 18 atm %≤y≤23 atm %, x+y=100 atm %) has a high spin polarization, a high coercive force, and a high anisotropic magnetic field, such a magnetic layer is more suitable to be used as a reference layer.

In a MnGe alloy used for a ferromagnetic layer, the c-axis is an easy magnetization axis. Accordingly, it is possible to manufacture a perpendicular magnetization MTJ element by controlling the orientation in crystallization so that the c-axis is along the direction perpendicular to the film plane.

In the first embodiment, it is desirable that an oxide insulator be used for the nonmagnetic layer 4. When an MTJ element has a stacked structure in which for example, a ferromagnetic layer of CoFe(B), a nonmagnetic layer of crystalline MgO, and a ferromagnetic layer of MnGe are stacked in this order, an orientation relationship of MnGe(001)/MgO(001)/CoFe(B)(001) can be established. Here, MnGe(001) or MgO(001) means that the crystalline orientation is such that the (001) surface is exposed on the top surface of each material. In this manner, it is possible to improve the wavenumber selectability of tunnel electrons, thereby obtaining a higher MR ratio.

It is possible to make the easy magnetization directions of the ferromagnetic layer 2 and the ferromagnetic layer 8 perpendicular to the film plane by controlling the direction of crystalline orientation. That is to say, the magnetoresistive element 1 according to this embodiment can be not only an in-plane magnetization MTJ element but also a so-called "perpendicular magnetization MTJ element," in which the directions of the magnetizations of the ferromagnetic layer 2 and the ferromagnetic layer 8 are perpendicular to the film planes, respectively. Incidentally, in this specification, the "film plane" means a plane perpendicular to the direction in which each ferromagnetic layer is stacked. Furthermore, the "easy magnetization direction" means a direction in a ferromagnetic material with a certain macro size, and if a spontaneous magnetization is along this direction in a state where there is no external magnetic field, the internal energy becomes the lowest. In contrast, the "hard magnetization direction" means a direction of a ferromagnetic material with a certain macro size, and if a spontaneous magnetization is along this direction in a state where there is no external magnetic field, the internal energy becomes the highest.

In one of the ferromagnetic layer 2 and the ferromagnetic layer 8, the magnetization direction does not change between before and after a write operation, by which a write current flows through the MTJ element 1, and in the other, the magnetization direction changes. The ferromagnetic layer in which the magnetization direction does not change will also be called a "reference layer," and the ferromagnetic layer in which the magnetization direction changes will also be called a "storage layer." In this embodiment, for example, the ferromagnetic layer 2 serves as a storage layer, and the ferromagnetic layer 8 serves as a reference layer. Incidentally, the write current is caused to flow between the ferromagnetic layer 2 and the ferromagnetic layer 8 in a direction perpendicular to the film plane. In a case where the ferromagnetic layer 2 is a storage layer and the ferromagnetic layer 8 is a reference layer, and the magnetization direction of the ferromagnetic layer 2 and the magnetization direction of the ferromagnetic layer 8 are antiparallel (reverse directions) to each other, the write current is caused to flow from the ferromagnetic layer 2 to the ferromagnetic layer 8. In this case, electrons flow from the ferromagnetic layer 8 toward the ferromagnetic layer 2 via the nonmagnetic layer 4. The electrons having been subjected to spin polarization by passing through the ferromagnetic layer 8 then flow into the ferromagnetic layer 2. The spin-polarized electrons with the spin in the same direction as the direction of the magnetization of the ferromagnetic layer 2 pass through the ferromagnetic layer 2, but the spin-polarized electrons with the spin in the direction opposite to the direction of the magnetization of the ferromagnetic layer 2 exert spin torque on the magnetization of the ferromagnetic layer 2 so that the direction of the magnetization of the ferromagnetic layer 2 becomes the same as the direction of the magnetization of the ferromagnetic layer 8. As a result, the direction of the magnetization of the ferromagnetic layer 2 is switched so as to be in parallel with (the same as) the direction of the magnetization of the ferromagnetic layer 8.

In contrast, in a case where the direction of the magnetization of the ferromagnetic layer 2 and the direction of the magnetization of the ferromagnetic layer 8 are parallel with each other, the write current is caused to flow from the ferromagnetic layer 8 toward the ferromagnetic layer 2. In this case, electrons flow from the ferromagnetic layer 2 toward the ferromagnetic layer 8 via the nonmagnetic layer 4. The electrons spin-polarized by passing through the ferromagnetic layer 2 flow into the ferromagnetic layer 8. Although the spin-polarized electrons with the spin in the same direction as the magnetization of the ferromagnetic layer 8 pass through the ferromagnetic layer 8, the spin-polarized electrons with the spin in the direction opposite to the magnetization of the ferromagnetic layer 8 are reflected at the interface between the nonmagnetic layer 4 and the ferromagnetic layer 8, and pass through the nonmagnetic layer 4 to flow into the ferromagnetic layer 2. As a result, the spin torque is exerted on the magnetization of the ferromagnetic layer 2, and the direction of the magnetization of the ferromagnetic layer 2 is caused to be opposite to the direction of the magnetization of the ferromagnetic layer 8. Accordingly, the direction of the magnetization of the ferromagnetic layer 2 is switched to be anti-parallel to the direction of the magnetization of the ferromagnetic layer 8.

Figure 1A:
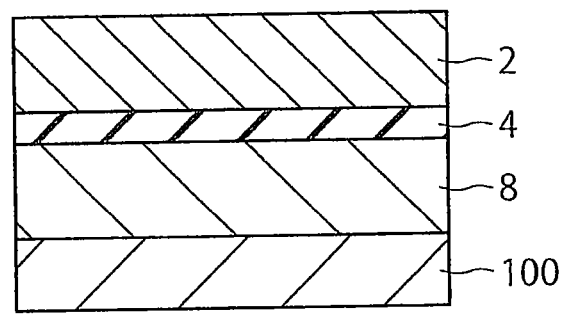
FIG. 1A is a sectional view showing a magnetoresistive element according to a modification of the first embodiment.

The first embodiment has a structure in which the ferromagnetic layer 2, the nonmagnetic layer 4, and the ferromagnetic layer 8 are stacked on the base layer 100 in this order. However, the order can be reversed on the base layer 100, as in a magnetoresistive element according to a modification of the first embodiment shown in FIG. 1A. That is to say, the ferromagnetic layer 8, the nonmagnetic layer 4, and the ferromagnetic layer 2 can be stacked on the base layer 100 in this order.

Second Embodiment

Figure 2:
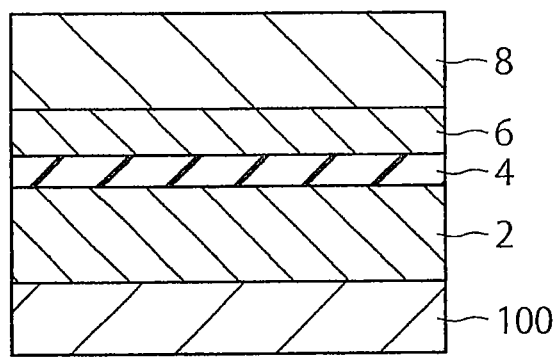
FIG. 2 is a sectional view showing a magnetoresistive element according to a second embodiment.

FIG. 2 shows a magnetoresistive element 1A according to a second embodiment. The magnetoresistive element 1A has a structure obtained by providing an interface magnetic layer 6 between the nonmagnetic layer 4 and the ferromagnetic layer 8 in the magnetoresistive element 1 of the first embodiment shown in FIG. 1. At least one of the ferromagnetic layer 2, the ferromagnetic layer 8, and the interface magnetic layer 6 includes a magnetic film of $Mn_xGe_y$ (77 atm %≤x≤82 atm %, 18 atm %≤y≤23 atm %, x+y=100 atm %).

Like the first embodiment, by controlling the crystalline orientation, the ferromagnetic layer 2 and the ferromagnetic layer 8 are caused to have magnetic anisotropy energy perpendicular to the film plane, by which it is possible to make the directions of the easy magnetizations thereof perpendicular to the film plane. That is to say, the magnetoresistive element 1A of this embodiment can be not only an in-plane magnetization MTJ element but also a so-called "perpendicular magnetization MTJ element," in which the directions of the magnetizations of the ferromagnetic layer 2 and the ferromagnetic layer 8 are perpendicular to the film planes, respectively. In one of the ferromagnetic layer 2 and the ferromagnetic layer 8, the magnetization direction does not change between before and after a write operation, by which a write current flows through the MTJ element 1, and in the other, the magnetization direction changes. In this embodiment, for example, the ferromagnetic layer 2 serves as a storage layer, and the ferromagnetic layer 8 serves as a reference layer. Like the first embodiment, the write current is caused to flow between the ferromagnetic layer 2 and the ferromagnetic layer 8 in a direction perpendicular to the film plane. Incidentally, the interface magnetic layer 6 is provided to increase the spin polarization.

In the second embodiment, for example, when the interface magnetic layer 6 of MnGe is formed on the nonmagnetic layer 4 of crystalline MgO, it is possible to perform epitaxial growth of the ferromagnetic layer 8 containing Mn and one or more elements selected from Al, Ge, and Ga on the interface magnetic layer 6. For example, in a case where an alloy containing Mn and Ga is selected to form the ferromagnetic layer 8, it is possible to have an epitaxial relationship of MnGa(001)/MnGe(001)/MgO(001). In this manner, it is possible to improve the wavenumber selectability of tunnel electrons, thereby obtaining a high MR ratio and at the same time obtaining a reference layer with a low-saturation magnetization.

Figure 2A:
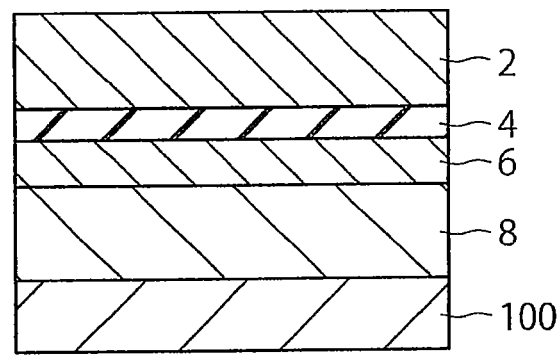
FIG. 2A is a sectional view showing a magnetoresistive element according to a modification of the second embodiment.

Furthermore, although the ferromagnetic layer 2, the nonmagnetic layer 4, the interface magnetic layer 6, and the ferromagnetic layer 8 are stacked on the base layer 100 in this order in the second embodiment, the order can be reversed on the base layer 100, as in a magnetoresistive element according to a modification of the second embodiment shown in FIG. 2A. That is to say, the ferromagnetic layer 8, the interface magnetic layer 6, the nonmagnetic layer 4, and the ferromagnetic layer 2 can be stacked on the base layer 100 in this order.

Third Embodiment

Figure 3:
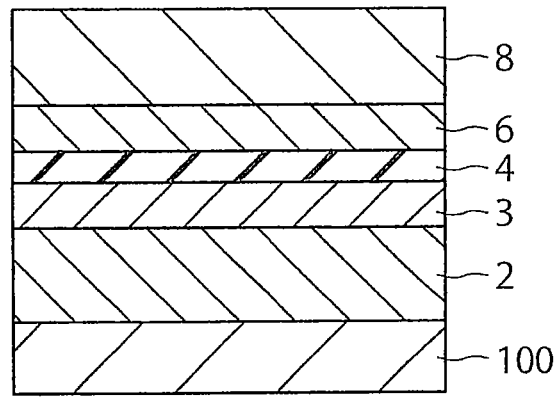
FIG. 3 is a sectional view showing a magnetoresistive element according to a third embodiment.

FIG. 3 shows a magnetoresistive element 1B according to a third embodiment. The magnetoresistive element 1B is obtained by inserting an interface magnetic layer 3 between the ferromagnetic layer 2 and the nonmagnetic layer 4 and inserting an interface magnetic layer 6 between the nonmagnetic layer 4 and the ferromagnetic layer 8 in the magnetoresistive element 1 according to the first embodiment shown in FIG. 1. At least one of the interface magnetic layer 3 and the interface magnetic layer 6 includes a magnetic film of $Mn_xGe_y$ (77 atm %≤x≤82 atm %, 18 atm %≤y≤23 atm %, x+y=100 atm %). The details of the properties of the interface magnetic layer 3 and the interface magnetic layer 6 will be described later.

The magnetoresistive element 1B of the third embodiment, like the magnetoresistive elements of the first and the second embodiments, can be not only an in-plane magnetization MTJ element but also a perpendicular magnetization MTJ element. Furthermore, like the magnetoresistive elements of the first and the second embodiments, the interface magnetic layer 3 and the interface magnetic layer 6 of the third embodiment are provided to increase the spin polarization.

Figure 3A:
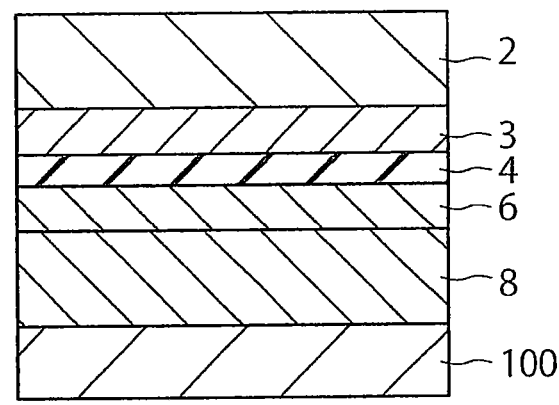
FIG. 3A is a sectional view showing a magnetoresistive element according to a modification of the third embodiment.

Although the ferromagnetic layer 2, the interface magnetic layer 3, the nonmagnetic layer 4, the interface magnetic layer 6, and the ferromagnetic layer 8 are stacked on the base layer 100 in this order in the third embodiment, the order can be reversed on the base layer 100, as in a magnetoresistive element according to a modification of the third embodiment shown in FIG. 3A. That is to say, the ferromagnetic layer 8, the interface magnetic layer 6, the nonmagnetic layer 4, the interface magnetic layer 3, and the ferromagnetic layer 2 can be stacked on the base layer 100 in this order.

Fourth Embodiment

Figure 4:
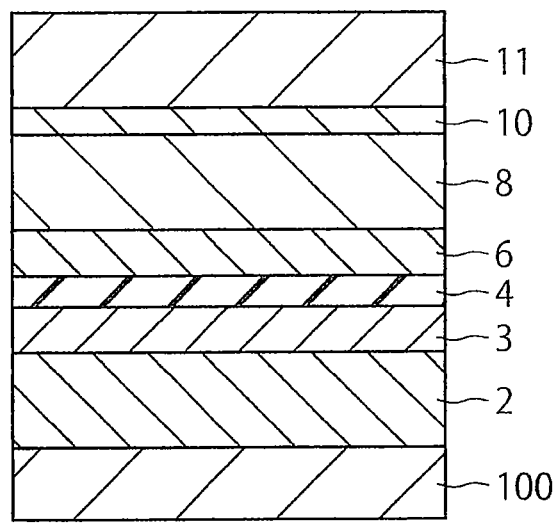
FIG. 4 is a sectional view showing a magnetoresistive element according to a fourth embodiment.

FIG. 4 shows a magnetoresistive element 1C according to a fourth embodiment. The magnetoresistive element 1C is obtained by stacking a nonmagnetic layer 10 and a ferromagnetic layer 11 on the ferromagnetic layer 8 in the magnetoresistive element 1B according to the third embodiment shown in FIG. 3. Incidentally, in this embodiment, for example, the interface magnetic layer 6 and the ferromagnetic layer 8 serve as a reference layer. The ferromagnetic layer 11 is also called a "bias layer," and has a magnetization that is anti-parallel (opposite direction) with the magnetization of the ferromagnetic layer 8. The ferromagnetic layer 11 can be coupled with the ferromagnetic layer 8 via the nonmagnetic layer 10 by synthetic-antiferromagnetic coupling. In this manner, it is possible to reduce and adjust the shift of the switching current of the storage layer formed of the interface magnetic layer 3 and the ferromagnetic layer 2 caused by the strayed magnetic field from the reference layer formed of the interface magnetic layer 6 and the ferromagnetic layer 8. It is desirable that the nonmagnetic layer 10 should have a heat resistance so that the ferromagnetic layer 8 and the ferromagnetic layer 11 are not mixed with each other in a heating process, and have a function of controlling crystalline orientation when the ferromagnetic layer 11 is formed.

When the thickness of the nonmagnetic layer 10 is increased, the distance between the ferromagnetic layer 11 and the storage layer (in this embodiment, the ferromagnetic layer 2, for example) is increased. Accordingly, the shift adjustment magnetic field applied from the ferromagnetic layer 11 to the storage layer is decreased. Therefore, it is desirable that the thickness of the nonmagnetic layer 10 be 5 nm or less. The ferromagnetic layer 11 is formed of a ferromagnetic material with an easy magnetization axis in a direction perpendicular to the film plane. Since the ferromagnetic layer 11 is more distant from the storage layer than the reference layer, in order to adjust the strayed magnetic field to be applied to the storage layer by means of the ferromagnetic layer 11, it is necessary to set the thickness or the magnitude of the saturation magnetization Ms of the ferromagnetic layer 11 to be greater than the thickness or the magnitude of the saturation magnetization Ms of the reference layer. That is to say, as a result of the study by the inventors of the present invention, it is necessary to meet the following relational expression wherein the thickness and the saturation magnetization of the reference layer are $t_2$ and $Ms_2$, respectively, and the thickness and the saturation magnetization of the ferromagnetic layer 11 are $t_3$ and $Ms_3$, respectively.

$$Ms_2 \times t_2 < Ms_3 \times t_3$$

Incidentally, the ferromagnetic layer 11 of the fourth embodiment can be applied to the magnetoresistive elements of the first and the second embodiments. In this case, the ferromagnetic layer 11 is formed above the ferromagnetic layer serving as the reference layer with the nonmagnetic layer 10 being sandwiched therebetween.

Figure 5:
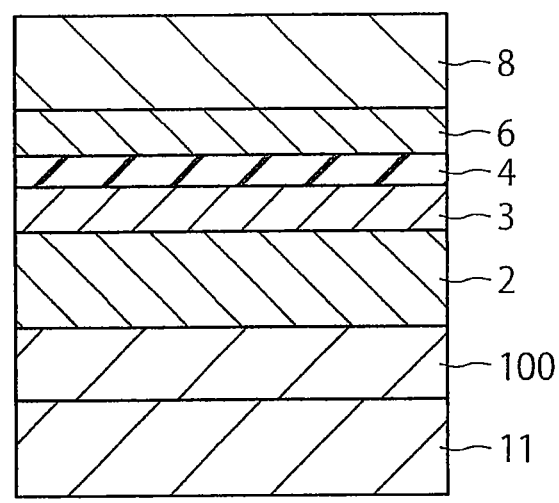
FIG. 5 is a sectional view showing a magnetoresistive element according to a modification of the fourth embodiment.
Figure 5A:
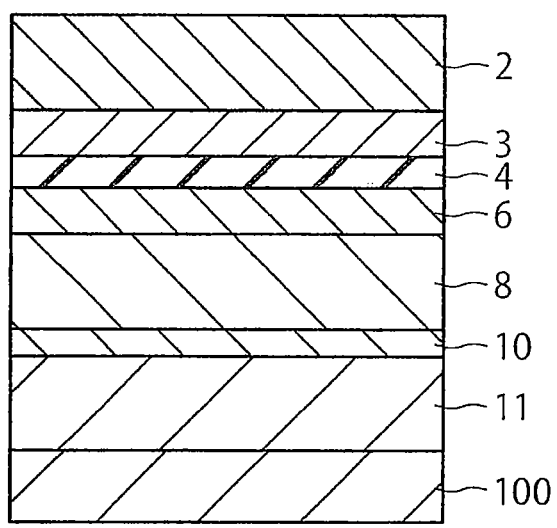
FIG. 5A is a sectional view showing a magnetoresistive element according to another modification of the fourth embodiment.
Figure 6:
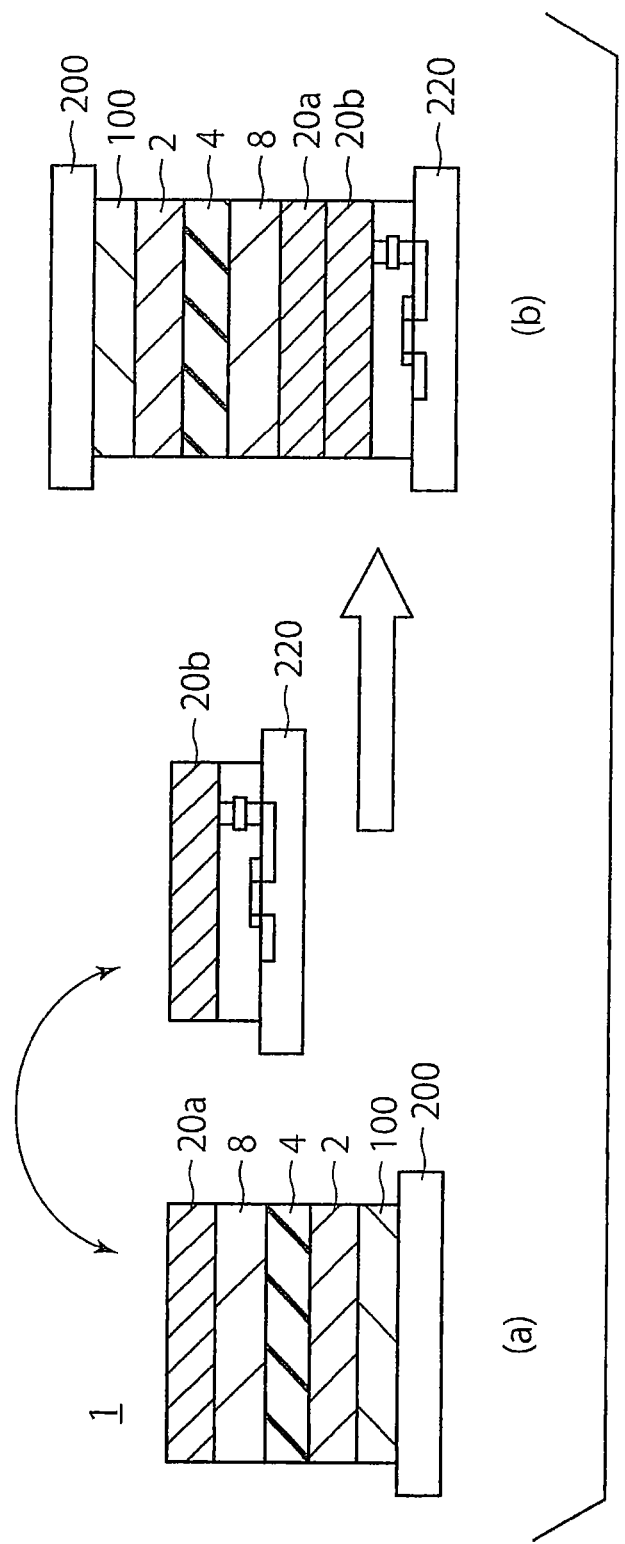
FIGS. 6(a) and 6(b) are for explaining a method of manufacturing an MTJ element including a magnetic film with a single crystal structure.
Figure 7:
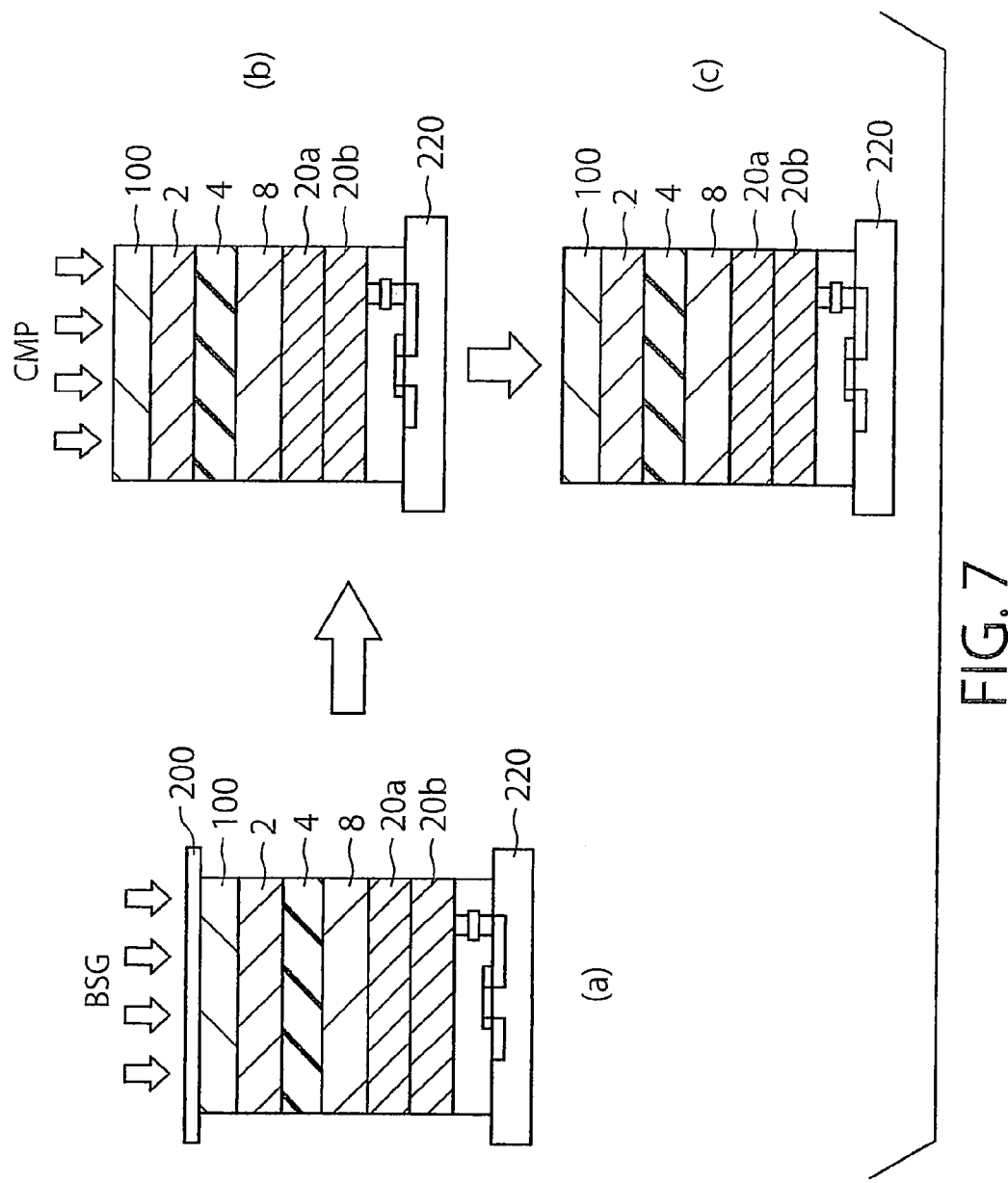
FIGS. 7(a) to 7(c) are for explaining a method of manufacturing an MTJ element including a magnetic film with a single crystal structure.

Although the fourth embodiment has a top bias structure, in which the ferromagnetic layer 2, the interface magnetic layer 3, the nonmagnetic layer 4, the interface magnetic layer 6, the ferromagnetic layer 8, the nonmagnetic layer 10, and the ferromagnetic layer 11 are stacked on the base layer 100 in this order, the ferromagnetic layer 11 can be stacked below the base layer 100. That is to say, like a magnetoresistive element 1D according to a modification of the fourth embodiment shown in FIG. 5, a bottom bias structure can be employed, in which the base layer 100, the ferromagnetic layer 2, the interface magnetic layer 3, the nonmagnetic layer 4, the interface magnetic layer 6, and the ferromagnetic layer 8 are stacked in this order on the ferromagnetic layer 11. In this case, it is preferable that the ferromagnetic layer 2 be used as a reference layer. Furthermore, the staking order can be reversed as in a magnetoresistive element according to another modification of the fourth embodiment shown in FIG. 5A. That is to say, the base layer 100, the ferromagnetic layer 11, the nonmagnetic layer 10, the ferromagnetic layer 8, the interface magnetic layer 6, the nonmagnetic layer 4, the interface magnetic layer 3, and the ferromagnetic layer 2 can be stacked in this order.

(MTJ Element Including Magnetic Film with Single Crystal Structure)

Next, a method of manufacturing an MTJ element including a magnetic film with a single crystal structure (hereinafter also referred to as "single crystal MT) element") will be explained. It is desirable that in a magnetoresistive element (MTJ element) according to any of the first to the fourth embodiments, at least one of the ferromagnetic layer 2, the ferromagnetic layer 8, the interface magnetic layer 3, and the interface magnetic layer 6 should be with a single crystal structure. The reason for this is that it is possible to suppress the dispersion of magnetic characteristics considerably by forming a magnetic film with a single crystal structure, in which the crystalline orientations in the in-plane directions of the film are aligned along one direction, thereby enhancing the magnetic coupling in the film. Furthermore, since the formation of grain boundary is curbed, it is possible to form a magnetic film or insulating layer, which is flattened in the atomic level, and which has good crystallinity. Accordingly, it can be expected that a magnetoresistive ratio (MR ratio) that is higher than the MR ratios of conventional MTJ elements can be obtained. Therefore, in order to achieve a large capacity MRAM of a few tens Gbits, it is necessary to manufacture a single crystal MTJ element.

However, generally, the wiring of a circuit includes a polycrystalline or amorphous structure, and thus it is not possible to grow a single crystal film thereon. Accordingly, it is difficult to grow a single crystal MTJ on a substrate on which transistors are implemented.

However, it is possible to form an MRAM including a single crystal MTJ element by preparing a substrate with a single crystal structure on which an MTJ element with a single crystal structure is formed and a substrate on which a transistor is formed, bonding the MTJ element formed on the single crystal substrate and the substrate on which the transistor is formed, and removing the single crystal substrate, which is unnecessary. This will be explained with reference to FIG. 6(a) to FIG. 7(c).

Specifically, first, an MTJ element according to any of the first to the fourth embodiments is formed on a Si single crystal substrate under appropriate film growth conditions. For example, as shown in FIG. 6(a), a base layer 100, a ferromagnetic layer 2, a nonmagnetic layer 4, and a ferromagnetic layer 8 are formed on a Si single crystal substrate 200 in this order by a sputtering method or MBE (Molecular Beam Epitaxy) method, thereby obtaining an MTJ element 1 of the first embodiment. At this time, the crystallinity of the Si single crystal substrate 200 is conveyed to the base layer 100, the ferromagnetic layer 2, the nonmagnetic layer 4, and the ferromagnetic layer 8, resulting in that the MTJ element 1 formed is a single crystal MTJ element 1. Thereafter, a metal bonding layer 20a is formed on the ferromagnetic layer 8 (FIG. 6(a)). Similarly, a substrate 220, on which a transistor circuit and wiring are formed, is prepared, and a metal bonding layer 20b is formed on the substrate 220 (FIG. 6(a)). The materials for forming the metal bonding layers 20a, 20b can be Al, Au, Cu, Ti, Ta, etc.

Next, the substrate 200, on which the single crystal MTJ element 1 is formed, and the substrate 220, on which the transistor circuit is formed, are positioned so that the metal bonding layers 20a, 20b are opposed to each other. For example, as shown in FIG. 6(a), the metal bonding layers 20a, 20b are opposed to each other. Thereafter, as shown in FIG. 6(b), the metal bonding layers 20a, 20b are contacted to each other. At this time, the metal bonding layers 20a, 20b can be bonded to each other by applying a pressure. When a pressure is applied, the metal bonding layers 20a, 20b can be heated in order to improve the bonding force.

Next, as shown in FIG. 7(a), the single crystal substrate 200, on which the single crystal MTJ element 1 is formed, is removed. The removal is performed in such a manner that first the substrate 200 is thinned by a BSG (Back Side Grinding) method, and then the thinned single crystal substrate 200 is mechanically polished by a CMP (Chemical Mechanical Polishing) method or the like as shown in FIG. 7(b). In this manner, the manufacturing of the MTJ element 1 is completed (FIG. 7(c)).

As explained above, a single crystal MTJ element according to any of the first to the fourth embodiments can be formed above the substrate by a manufacturing method including a series of the processes of preparing the single crystal substrate 200 on which a single crystal MTJ element according to any of the first to the fourth embodiments is formed and the substrate 220 on which a transistor circuit is formed, bonding the substrate on which transistors etc. are formed onto the single crystal MTJ element 1, and then removing the single crystal substrate 200 that is unnecessary.

Next, the specific composition of each layer included in the MTJ elements 1, 1A, 1B, 1C and 1D of the first to the fourth embodiments will be explained in the order of the ferromagnetic layer 2, the ferromagnetic layer 8, the base layer 100, the nonmagnetic layer 4, the interface magnetic layer 3, and the interface magnetic layer 6.

(Ferromagnetic Layer 2)

The ferromagnetic layer 2 is a perpendicular magnetization film. In order to achieve both a high thermal stability and a low-current magnetization switching, it is desirable that the material of the ferromagnetic layer 2 be with a low saturation magnetization Ms, a high magnetic anisotropy energy Ku that is high enough to maintain a thermal stability factor A, and a coercive force, an anisotropic magnetic field and a Gilbert damping constant that are lower than those of the material used for the ferromagnetic layer 8. Furthermore, it is desirable that the material show a high spin polarization. The following is the specific explanation thereof.

A first example of the ferromagnetic layer 2 is formed of a MnGe alloy. $Mn_xGe_y$ has a characteristic of a perpendicular magnetization film when the composition ratio x of Mn is in the range of 77 atm %≤x≤82 atm %, and the composition ratio y of Ge is in the range of 18 atm %≤y≤23 atm % (x+y=100 atom %). The magnetization of a MnGe alloy is oriented along a specific crystal orientation. By changing the forming conditions, it is possible to form a MnGe alloy with a coercive force, an anisotropic field and a Gilbert damping constant that are lower than those of a material used to form the ferromagnetic layer 8.

A second example of the ferromagnetic layer 2 is formed of, for example, an alloy containing one element selected from the group consisting of Mn, Fe, Co, and Ni, and two elements selected from the group consisting of Zn, Al, Ga, In, Si, Ge, Sn, As, Sb, and Bi. Specific examples are MnAlGe, MnGaGe, MnZnSb, and so on.

In order to cause the aforementioned materials to have perpendicular magnetic anisotropy, it is required that the c-axis be grown perpendicular to the film plane, i.e., grown to be (001) oriented. Specifically, by appropriately selecting the base layer 100, it is possible to control the crystal orientation in the growth of the ferromagnetic layer 2. The details of the base layer 100 will be described later.

A third example of the ferromagnetic layer 2 is formed of an alloy containing at least one metal selected from the group consisting of Fe and Co. Incidentally, in order to control the saturation magnetization of the ferromagnetic layer 2, at least one element selected from the group consisting of Ni, B, C, P, Ta, Ti, Mo, Si, W, Nb, Mn, and Ge may be added thereto. That is, the ferromagnetic layer 2 can be formed of an alloy containing at least one element selected from the group consisting of Fe and Co, and at least one element selected from the group consisting of Ni, B, C, P, Ta, Ti, Mo, Si, W, Nb, Mn, and Ge. For example, CoFeSi, CoFeP, CoFeW, CoFeNb, etc. may be used besides CoFeB.

(Ferromagnetic Layer 8)

It is preferable that the ferromagnetic layer 8 have an easy magnetization axis in a direction perpendicular to the film plane, a low saturation magnetization Ms, a high magnetic anisotropy energy Ku that is high enough to maintain a thermal stability factor Δ, and a coercive force, an anisotropic magnetic field and a Gilbert damping constant that are higher than those of the material used for the ferromagnetic layer 2. Furthermore, it is desirable that the material show a high spin polarization. A MnGe alloy magnetic material containing Mn and Ge is one of the material that meet such requirements. The following is the specific explanation thereof.

A specific example of the ferromagnetic layer 8 is formed of a MnGe alloy. The characteristics of $Mn_xGe_y$ as a perpendicular magnetization film appear when the composition ratio x of Mn is in the range of 77 atm %≤x≤82 atm %, and the composition ratio y of Ge is in the range of 18 atm %≤y≤23 atm % (x+y=100 atm %).

The magnetization of a MnGe alloy with a high crystal magnetic anisotropy is oriented along a specific crystal orientation. By changing the composition ratios and the crystallinity of the constituent elements, it is possible to control the degree of crystal magnetic anisotropy. Accordingly, it is possible to control the direction of magnetization by changing the direction of crystal growth. Furthermore, since a MnGe alloy itself has a high crystal magnetic anisotropy, it is possible to adjust the aspect ratio of the device with it. Moreover, since a MnGe alloy has a high thermal stability, it is suitable to be integrated.

Figure 8:
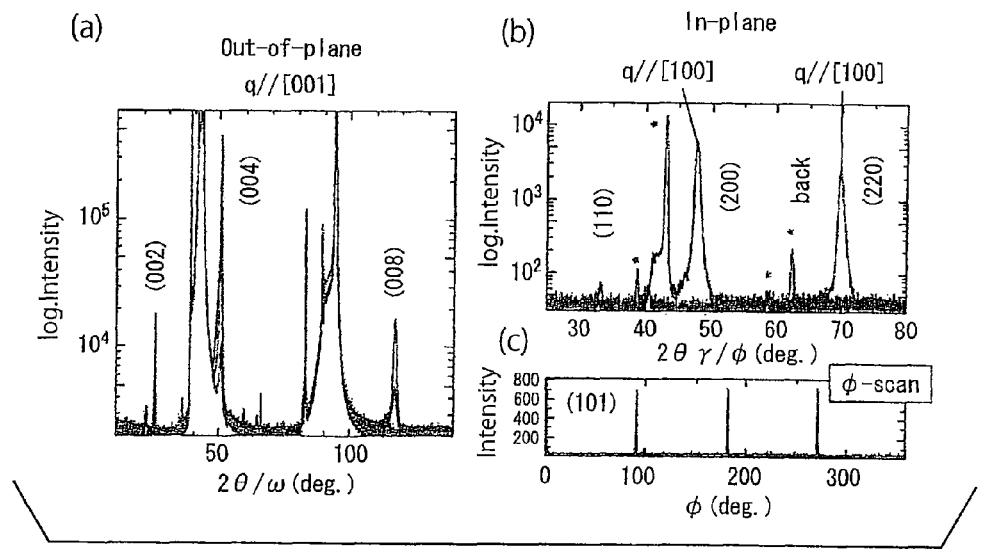
FIGS. 8(a) to 8(c) show examples of x-ray diffraction on a MnGe alloy.
Figure 9:
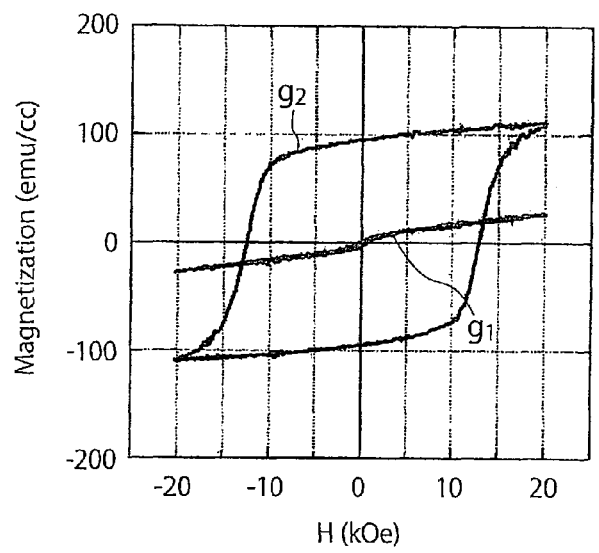
FIG. 9 shows examples of magnetization curve of a MnGe alloy.

As examples, FIGS. 8(a), 8(b) and 8(c) show the results of x-ray diffraction of MnGe (with the composition ratios of Mn being 79 atm %, and Ge being 21 atm %) formed on MgO (001), and FIG. 9 shows magnetization curves. The composition ratios given here are calculated by an analysis by ICP (Inductively Coupled Plasma). It is confirmed that by forming a MnGe film by heat treatment on MgO, the orientation of which is controlled, it is possible to form the MnGe film that is highly (001)-oriented (see FIGS. 8(a), 8(b) and 8(c)). Furthermore, it is confirmed that the characteristics required for a reference layer have been met since the saturation magnetization Ms of MnGe thus obtained is as low as 97 emu/cc, and the effective perpendicular magnetic anisotropy energy Ku thereof is as high as $3.2 \times 10^6$ erg/cc (see FIG. 9). The graph $g_1$ of FIG. 9 shows the magnetization curve in the case where a magnetic field is applied in a direction parallel to the film plane of the MnGe film, and the graph $g_2$ shows the magnetization curve in the case where a magnetic field is applied in a direction perpendicular to the film plane of the MnGe film.

The effect of a strayed magnetic field from a reference layer becomes more remarkable as an MTJ element is miniaturized. As a method of solving this problem, the introduction of a bias layer is effective. A detailed explanation of a bias layer will be provided later. According to a prestudy by calculation, assuming that the shape of an MTJ element is cylindrical (pillar shape), when the thickness of a reference layer is 6 nm, the allowable size (diameter size) in the miniaturization process of an MTJ element is about 38 nm when the saturation magnetization Ms of the reference layer is 1000 emu/cc, about 28 nm when Ms is 750 emu/cc, and about 20 nm when Ms is 500 emu/cc.

From the above, it is desirable that in order to highly integrate an MTJ element having a diameter of 15 nm or less, a low Ms material of 200 emu/cc or less be used for a reference layer. In order to achieve this, $Mn_xGe_y$ can be used for a reference layer. From FIG. 9, the saturation magnetization Ms of an MnGe alloy is as low as 97 emu/cc. Thus, it is more preferable that an MnGe alloy be used as a low Ms reference layer.

As the element size is decreased, the thermal stability of a ferromagnetic material constituting a magnetoresistive element deteriorates. As an option for solving this problem, the perpendicular magnetic anisotropy energy Ku can be improved. The effective perpendicular magnetic anisotropy energy Ku of a MnGe alloy obtained by a calculation using the values of saturation magnetization and anisotropic magnetic field obtained from FIG. 9 is as high as $3.2 \times 10^6$ erg/cc.

Thus, it is possible to use this alloy to form a reference layer that is superior in thermal stability.

Figure 10:
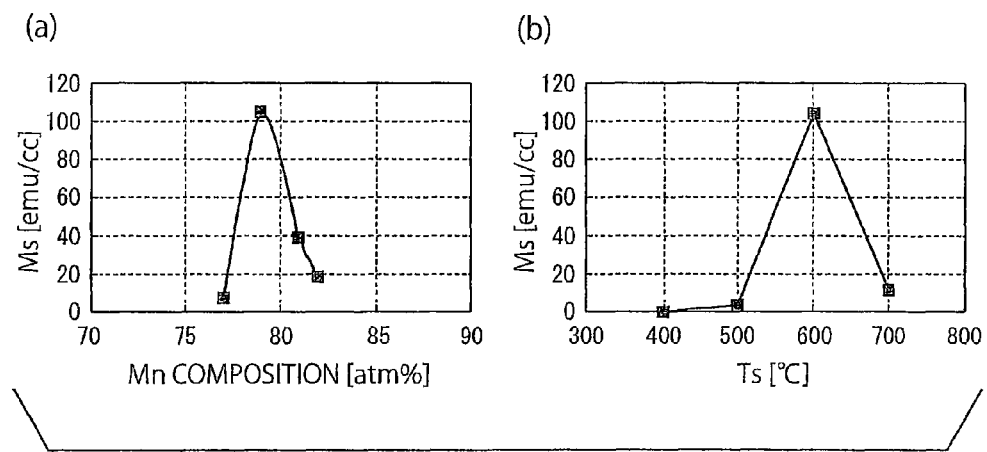
FIGS. 10(a) and 10(b) show examples of the characteristics that the saturation magnetization of a MnGe alloy is dependent on the composition and the substrate temperature.

From the foregoing viewpoints, it could be understood that a magnetic film formed of an MnGe alloy is a perpendicular magnetic film with a low saturation magnetization and a high perpendicular magnetic anisotropy energy, and is especially suitable to form a reference layer. FIG. 10(a) shows the dependency of saturation magnetization of a MnGe alloy on the composition ratio, and FIG. 10(b) shows the dependency thereof on the substrate temperature. It could be confirmed from FIGS. 10(a) and 10(b) that it is possible to control the saturation magnetization by selecting optimum composition ratio and substrate temperature.

In order to cause the perpendicular magnetic anisotropy energy to appear, the c-axis should be (001)-oriented, i.e., in the direction perpendicular to the film plane. Specifically, by appropriately selecting the tunnel barrier layer and the interface magnetic layer, the (001) orientation growth can be achieved.

Figure 11:
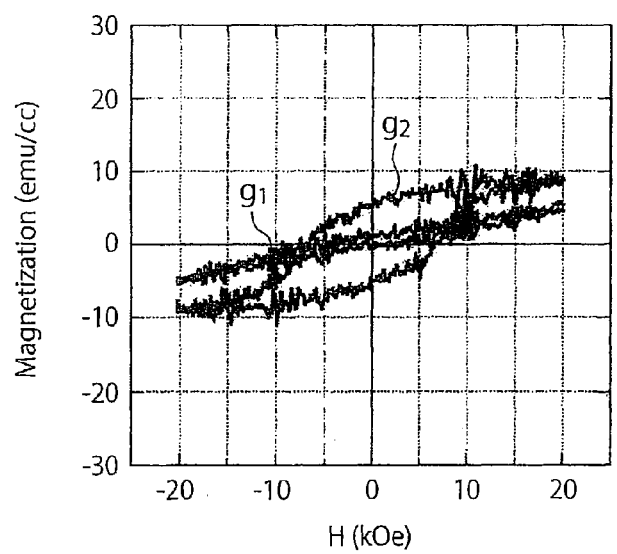
FIG. 11 shows examples of magnetization curve in the cases where Al is slightly added to a MnGe alloy on a thermally oxidized Si substrate.

An example of the material of the ferromagnetic layer 8 is an alloy containing $Mn_xGe_y$ (77 atm % $\leq$ x $\leq$ 82 atm %, 18 atm % $\leq$ y $\leq$ 23 atm %, x+y=100 atm %) and 10 atm % or less of at least one element selected from the group consisting of Al, Si, B, C, P, Ti, Zn, Mg, Ca, Cr, and Ga. That is, if the aforementioned element is expressed as "X," the alloy can be expressed as $(Mn_xGe_y)_{100-z}X_z$ (77 atm % $\leq$ x $\leq$ 82 atm %, 18 atm % $\leq$ y $\leq$ 23 atm %, x+y=100 atm %, z $\leq$ 10 atm %). FIG. 11 shows examples of the magnetization curve of a thin film obtained by adding 5 atm % of Al to MnGe formed on a thermally oxidized Si substrate. The graph $g_1$ of FIG. 11 shows the magnetization curve in the case where a magnetic field is applied in a direction parallel to the film plane of this ferromagnetic layer, and the graph $g_2$ shows the magnetization curve in the case where a magnetic field is applied in a direction perpendicular to the film plane of the ferromagnetic layer. It could be confirmed from FIG. 11 that MnGe with a slight amount of Al being added thereto is not easily affected by the base layer, and has a characteristic of a perpendicular magnetization film. Furthermore, it could be confirmed that the addition of a slight amount of a light element represented by Al, which has a low melting point and a high diffusing property, would effectively contribute to a further lowering of magnetization of perpendicular magnetic film.

In the case where the magnetoresistive element has an interface magnetic layer 6 as in the second to the fourth embodiments, the interface magnetic layer 6 being formed of $Mn_xGe_y$ (77 atm % $\leq$ x $\leq$ 82 atm %, 18 atm % $\leq$ y $\leq$ 23 atm %, x+y=100 atm %), the following materials can be used to form the ferromagnetic layer 8. As a material of the ferromagnetic layer 8, for example, a metal that has the (111) crystalline orientation of a face-centered cubic (FCC) structure or has the (0001) crystalline orientation of a hexagonal close-packed (HCP) structure, or a metal that can form an artificial lattice, or an alloy containing Mn and at least one element selected from the group consisting of Al, Ge, and Ga can be used. An example of a metal that has the (111) crystalline orientation of a FCC structure or the (0001) crystalline orientation of a HCP structure is an alloy containing at least one element selected from the first group consisting of Fe, Co, Ni, and Cu and at least one element selected from the second group consisting of Pt, Pd, Rh, and Au. Specifically, ferromagnetic alloys such as CoPd, CoPt, NiCo, NiPt, and the like can be used. Specific examples of alloy containing Mn and at least one element selected from the group consisting of Al, Ge, and Ga are ferromagnetic alloys such as MnGa, MnAlGe, and MnGaGe.

The artificial lattice to be used for the ferromagnetic layer 8 has a structure in which layers each containing one or more elements selected from the group consisting of Fe, Co, and Ni or an alloy containing the one or more elements (ferromagnetic films) and layers each containing one element selected from the group consisting of Cr, Pt, Pd, Ir, Rh, Ru, Os, Re, Au, and Cu or an alloy containing the one element (nonmagnetic films) are alternately stacked. For example, Co/Pt artificial lattice, Co/Pd artificial lattice, CoCr/Pt artificial lattice, Co/Ru artificial lattice, Co/Os artificial lattice, Co/Au artificial lattice, Ni/Cu artificial lattice, and the like can be used. It is possible to adjust the magnetic anisotropy energy density and the saturation magnetization of such artificial lattices by adding an element to the ferromagnetic film, or by adjusting the ratio of thicknesses between the ferromagnetic film and the nonmagnetic film.

Furthermore, the material of the ferromagnetic layer 8 can be an alloy containing at least one element selected from the group consisting of transition metals Fe, Co, and Ni, and at least one element selected from the group consisting of rare earth metals Tb, Dy, and Gd. Examples are TbFe, TbCo, TbFeCo, DyTbFeCo, GdTbCo and the like. Furthermore, a multi-layer structure in which these alloys are alternately stacked can be employed. Specific examples are multi-layer films of TbFe/Co, TbCo/Fe, TbFeCo/CoFe, DyFe/Co, DyCo/Fe, DyFeCo/CoFe, and the like. It is possible to adjust the magnetic anisotropy energy density and the saturation magnetization of these alloys by adjusting the thickness ratio or composition.

Moreover, a material used to form the ferromagnetic layer 8 can be an alloy containing one or more elements selected from the first group consisting of Fe, Co, Ni, and Cu and one or more elements selected from the second group consisting of Pt, Pd, Rh, and Au. Specific examples are ferromagnetic alloys of FeRh, FePt, FePd, CoPt, and the like.

(Base Layer 100)

The base layer 100 is used to control the crystallinity such as crystalline orientation, grain size, etc. of the ferromagnetic layer 2 and the layers above the ferromagnetic layer 2. Accordingly, the selection of the material of the base layer 100 is important. Hereinafter, the material and the structure of the base layer 100 will be explained. Incidentally, although both conductive and insulating materials can be used to form a base layer, if a current should flow through the base layer, it is preferable that a conductive material be used.

A first example of the base layer 100 is a layer of nitride having a (001) oriented NaCl structure and containing at least one element selected from the group consisting of Ti, Zr, Nb, V, Hf, Ta, Mo, W, B, Al, and Ce.

A second example of the base layer 100 is a (002) oriented perovskite conductive oxide layer of $ABO_3$. The A-site contains at least one element selected from the group consisting of Sr, Ce, Dy, La, K, Ca, Na, Pb, and Ba, and the B-site contains at least one element selected from the group consisting of Ti, V, Cr, Mn, Fe, Co, Ni, Ga, Nb, Mo, Ru, Ir, Ta, Ce, and Pb.

A third example of the base layer 100 is a layer of oxide having a (001) oriented NaCl structure and containing at least one element selected from the group consisting of Mg, Al, and Ce.

A fourth example of the base layer 100 is a layer having a (001) oriented tetragonal or cubic structure and containing at least one element selected from the group consisting of Al, Cr, Fe, Co, Rh, Pd, Ag, Ir, Pt, Au, Mo, and W.

A fifth example of the base layer 100 is a layer having a stacked structure with a combination of two or more of the layers of the above first to fourth examples. Thus, by devising the structure of the base layer as mentioned above, it is possible to control the crystallinity of the ferromagnetic layer 2 and the layers above the ferromagnetic layer 2, thereby improving the magnetic characteristics.

(Nonmagnetic Layer 4)

The nonmagnetic layer 4 can have a conductive or insulating property. However, it is preferable that a tunnel barrier layer of an insulating material be used. With respect to the nonmagnetic layer 4, it is possible to achieve a selective tunnel conduction and a high MR ratio by appropriately combining the nonmagnetic layer 4 with the adjacent ferromagnetic layer or interface magnetic layer. Accordingly, the selection of the material of the nonmagnetic layer 4 is important. Hereinafter, the material for forming the nonmagnetic layer 4 will be explained.

As a material of a tunnel barrier layer, an oxide containing at least one element selected from the group consisting of Mg, Ca, Ba, Al, Be, Sr, Zn, Ti, V, and Nb can be considered. Specific examples are MgO, AlO, ZnO, SrO, BaO, TiO, and the like. In particular, an oxide with a crystal structure of NaCl structure is preferable. Specific examples thereof are MgO, CaO, SrO, BaO, TiO, VO, NbO, and the like. If crystal growth of such an oxide with NaCl structure is performed on a (001) surface of any of Fe, Co, and Ni, or an alloy containing two or more of these elements as main ingredients, or any of metals having a body-centered tetragonal structure with preferred orientation of (001), or an alloy containing two or more of such metals as main ingredients, or a MnGe alloy, the crystal growth can be performed easily with the (001) surface being a preferred orientation surface. In particular, it is possible to achieve preferred orientation of (001) surface if crystal growth is performed on a CoFe—X amorphous alloy, which includes a very small amount of B, C, N, Ti, Ta, P, Mo, Si, W, Nb, and the like to improve the amorphous property. Here, X indicates an added element such as B, C, N, and the like.

The tunnel barrier layer can be of a mixed crystal containing two or more materials selected from the aforementioned group of oxides, or have a stacked structure with layers of such oxides. Examples of such a mixed crystal are MgAlO, MgZnO, MgTiO, MgCaO, and the like. Examples of the materials of a two-layer stacked structure are MgO/ZnO, MgO/AlO, TiO/AlO, MgAlO/MgO, and the like. Examples of the materials of a three-layer stacked structure are AlO/MgO/AlO, ZnO/MgO/ZnO, MgAlO/MgO/MgAlO, and the like.

A second example of the tunnel barrier layer is a (002) oriented perovskite oxide of $ABO_3$. Here, the A-site contains at least one element selected from the group consisting of Sr, Ce, Dy, La, K, Ca, Na, Pb, and Ba, and the B-site contains at least one element selected from the group consisting of Ti, V, Cr, Mn, Fe, Co, Ni, Ga, Nb, Mo, Ru, Ir, Ta, Ce, and Pb. The specific examples are $SrTiO_3$, $SrRuO_3$, $SrNbO_3$, $BaTiO_3$, $PbTiO_3$, and the like. The lattice constant of the [100] plane of each of these oxides is about 3.7 Å-4.0 Å, which is close to the lattice constant of about 3.8 Å of the [100] plane of a MnGe alloy. Accordingly, these oxides are suitable for forming an interface with good quality to obtain a higher MR ratio.

A third example of the tunnel barrier layer is a spinel oxide of MgAlO. The lattice constant of $MgAl_2O_4$ having the spinet structure is about 4.05 Å, the lattice mismatch of which relative to the lattice constant of the [100] plane of a MnGe alloy, which is about 3.8 Å, is as small as 6.6%. Accordingly, this material is suitable for forming an interface with good quality to obtain a higher MR ratio.

The tunnel barrier layer can be formed of either a crystalline or amorphous material. However, if the tunnel barrier layer is formed of a crystalline material, the scattering of electrons in a tunnel barrier is curbed, resulting in that the probability would increase that the electrons would be selectively conducted by tunneling from the ferromagnetic layer with the wavenumber thereof being maintained. Accordingly, it is possible to increase the MR ratio. Therefore, in order to obtain a higher MR ratio, a crystalline tunnel barrier is preferable.

For example, when an MTJ element has a stacked structure including a ferromagnetic layer of CoFe(B), a nonmagnetic layer of crystalline MgO, and a ferromagnetic layer of MnGe, which layers are stacked in this order, an orientaiton relationship of MnGe(001)/MgO(001)/CoFe(B)(001) can be established. As a result, it is possible to improve the wavenumber selectivity of tunnel electrons, and to obtain a higher MR ratio. However, the lattice mismatch obtained from the bulk lattice constants of MnGe and MgO in the in-plane direction is as high as about 11.0%. The lattice mismatch is defined by the following expression:

$$(a(MgO)-a(MnGe))/a(MnGe) \times 100$$

where a(MgO) and a(MnGe) are the lattice constants of MgO and MnGe in the in-plane direction of the film, respectively. If a lattice mismatch is large, a dislocation or the like is caused at the interface in order to reduce the interface energy generated by lattice distortion. In this case, an epitaxial relationship is established between crystal grains, and it is difficult to perform a uniform epitaxial growth in the film plane. When a current is caused to flow through an MTJ element, a dislocation works as a source of the scattering of electrons, and the MR ratio is decreased. Therefore, in order to perform a uniform epitaxial growth in the film plane without causing a dislocation, it is important to form a stacked structure using materials with smaller lattice mismatch. Accordingly, from the viewpoint of lattice mismatch, a perovskite oxide, a spinel oxide, a NaCl structure oxide, with the preference set in this order, are suitable materials for forming a nonmagnetic layer.

(Interface Magnetic Layer 3 and Interface Magnetic Layer 6)

Both the interface magnetic layer 3 and the interface magnetic layer 6 are perpendicular magnetization films. In order to meet the requirements of a high thermal stability and a low-current magnetization switching, it is preferable that these layers be formed of a material with a low saturation magnetization Ms, a high magnetic anisotropy energy Ku to maintain a thermal stability factor $\Delta$, and a high spin polarization. An example of such a material meeting the aforementioned requirements is a MnGe alloy magnetic material containing Mn and Ge. This material will be specifically explained below.

Specific examples of the interface magnetic layer 3 and the interface magnetic layer 6 are formed of a MnGe alloy. The characteristic of $Mn_xGe_y$ as a perpendicular magnetization film appears when the composition ratio x of Mn is in the range of 77 atm %≤x≤82 atm %, and the composition ratio y of Ge is in the range of 18 atm %≤y≤23 atm %. In order to cause perpendicular magnetic anisotropy energy to appear, it is necessary that the c-axis is grown in the direction perpendicular to the film plane, i.e., (001) oriented. Specifically, it is possible to control the crystalline orientation of the ferromagnetic layer 2 and the interface magnetic layer 3 by appropriately selecting the material of the base layer 100. Furthermore, it is possible to control the crystalline orientation of the interface magnetic layer 6 and the ferromagnetic layer 8 by appropriately selecting the material of the nonmagnetic layer 4.

Generally, there is a correlation between a Gilbert damping constant and a magnitude of spin-orbit interaction of a material. A material having a higher atomic number has greater spin-orbit interaction, and a higher Gilbert damping constant. Since MnGe is a material formed of light elements, it is expected that the Gilbert damping constant thereof is low. Accordingly, the energy required for magnetization switching thereof is low. Therefore, the current density for magnetization reversal by spin polarized electrons can be considerably reduced. Thus, MnGe can be effectively applied to the interface ferromagnetic layer 3.

Figure 12:
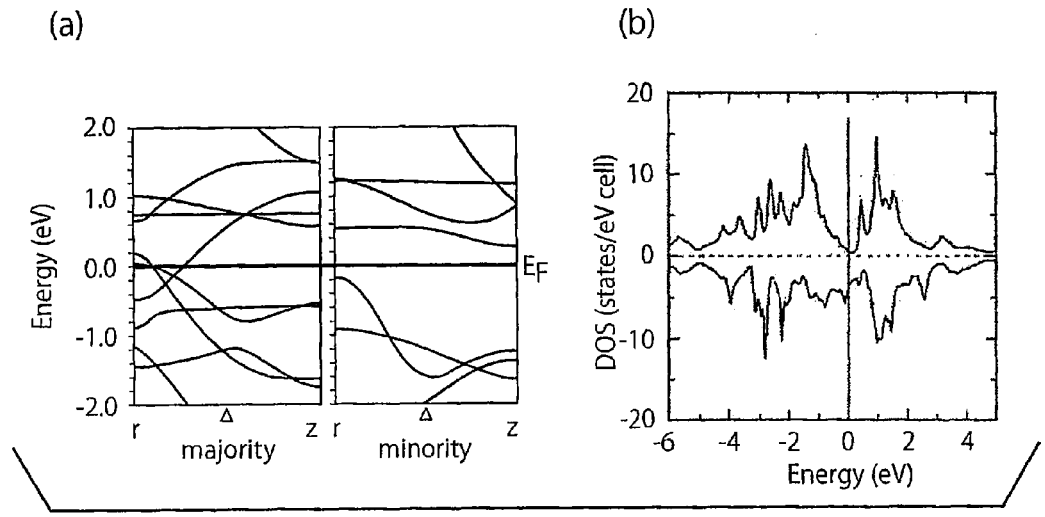
FIGS. 12(a) and 12(b) show the band structure and the density of states of a bulk MnGe alloy, which are obtained by calculation.

As examples, FIG. 12(*a*) shows the band structures of a bulk MnGe alloy, which are obtained by calculation. FIG. 12(*b*) shows the density of states thereof. It could be understood from FIG. 12(*a*) that in the Majority state, the Δ1 band crosses the Fermi energy $E_F$ while in the Minority state, the Δ1 band does not cross the Fermi energy $E_F$. This means that the spin of the electrons moving in the c-axis direction is completely polarized. From FIG. 12(*b*), the spin polarization P could be estimates as −78% and the saturation magnetization Ms could be estimated as 183 emu/cc. Thus, it is understood that such a material is suitable to form an interface magnetic layer of a storage layer or reference layer.

A second example of the interface magnetic layer 3 and the interface magnetic layer 6 can be formed of, for example, an alloy containing one element selected from the group consisting of Mn, Fe, Co, and Ni, and two elements selected from the group consisting of Zn, Al, Ga, In, Si, Ge, Sn, As, Sb, and Bi. Specifically, MnAlGe, MnGaGe, MnZnSb, and the like can be used.

A third example of the interface magnetic layer 3 and the interface magnetic layer 6 can be formed of, for example, an alloy containing at least one metal selected from the group consisting of Fe and Co. For example, it is desirable that the interface magnetic layer 6 be formed of an alloy containing at least one metal selected from the group consisting of Fe and Co. For example, when an interface magnetic layer of CoFe, a nonmagnetic layer of MgO, and an interface magnetic layer of CoFe are stacked, it is possible to establish the orientaiton relationship of CoFe(001)/MgO(001)/CoFe(001). In such a case, it is possible to improve the wavenumber selectability of tunnel electrons, resulting in that it is possible to obtain a high MR ratio. Incidentally, in order to control the saturation magnetizations of the interface magnetic layer 3 and the interface magnetic layer 6, it is possible to add at least one element selected from the group consisting of Ni, B, C, P, Ta, Ti, Mo, Si, W, Nb, Mn, and Ge thereto. That is to say, the interface magnetic layer 3 and the interface magnetic layer 6 can be formed of an alloy containing at least one element selected from the group consisting of Fe and Co, and at least one element selected from the group consisting of Ni, B, C, P, Ta, Ti, Mo, Si, W, Nb, Mn, and Ge. For example, CoFeSi, CoFeP, CoFeW, CoFeNb, and the like, besides CoFeB, can be such an alloy. These alloys have a spin polarization equivalent to that of CoFeB. Furthermore, a Heusler alloy such as $Co_2FeSi$, $Co_2MnSi$, $Co_2MnGe$ and the like can be used. A Heusler alloy has a spin polarization equivalent to or higher than that of CoFeB. Accordingly, a Heusler alloy is suitable as a material of the interface magnetic layers.

Furthermore, a fourth example of the interface magnetic layer 3 and the interface magnetic layer 6 can be formed of a MnAl alloy, for example. Since a MnAl alloy is formed of light metals, the Gilbert damping constant thereof is low, resulting in that the energy required for magnetization switching would be low. Accordingly, it is possible to considerably reduce the current density for switching magnetization by means of spin polarized electrons. Moreover, since a MnAl alloy has an energy gap relative to either the spinband of up-spin or the spinband of down-spin in the (001) direction, it has a half-metallic characteristic and a high spin polarization, resulting in that it is possible to obtain a high MR ratio.

Since it is possible to obtain a high MR ratio as long as the interface magnetic layer 3 and the interface magnetic layer 6 are epitaxially grown against the nonmagnetic layer 4, the interface magnetic layer 3 and the interface magnetic layer 6 contacting the nonmagnetic layer 4 can expand or shrink in the direction perpendicular to the film plane.

Fifth Embodiment

Next, a magnetic memory (MRAM) of spin transfer torque writing type according to a fifth embodiment will be explained below.

Figure 13:
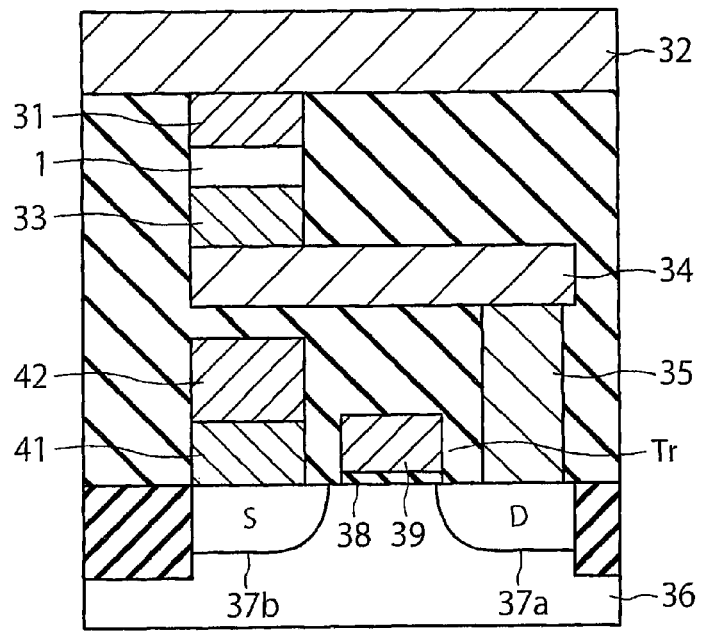
FIG. 13 is a sectional view showing a memory cell of a magnetic memory according to a fifth embodiment.

The MRAM according to this embodiment includes a plurality of memory cells. FIG. 13 is a sectional view of the main part of a memory cell of the MRAM according to this embodiment. Each memory cell has a magnetoresistive element according to any of the first to the fourth embodiments as a storage element. In the explanation of the fifth embodiment, the storage element is assumed to be the magnetoresistive element (MTJ element) 1 of the first embodiment.

As shown in FIG. 13, the top surface of the MTJ element 1 is connected to a bit line 32 via an upper electrode 31. Furthermore, the bottom surface of the MTJ element 1 is connected to a drain region 37*a* of source/drain regions of a surface of a semiconductor substrate 36 via a lower electrode 33, a leading electrode 34, and a plug 35. The drain region 37*a* constitutes a selection transistor Tr with a source region 37*b*, a gate insulating film 38 formed on the substrate 36, and a gate electrode 39 formed on the gate insulating film 38. The selection transistor Tr and the MTJ element 1 constitute one memory cell of the MRAM. The source region 37*b* is connected to another bit line 42 via a plug 41. Incidentally, it is possible to exclude the leading electrode 34, to provide the plug 35 below the lower electrode 33, and to connect the lower electrode 33 the plug 35 directly. The bit lines 32 and 42, the electrodes 31 and 33, the leading electrode 34, and the plugs 35 and 41 are formed of any one of W, Al, AlCu, Cu, and the like.

Figure 14:
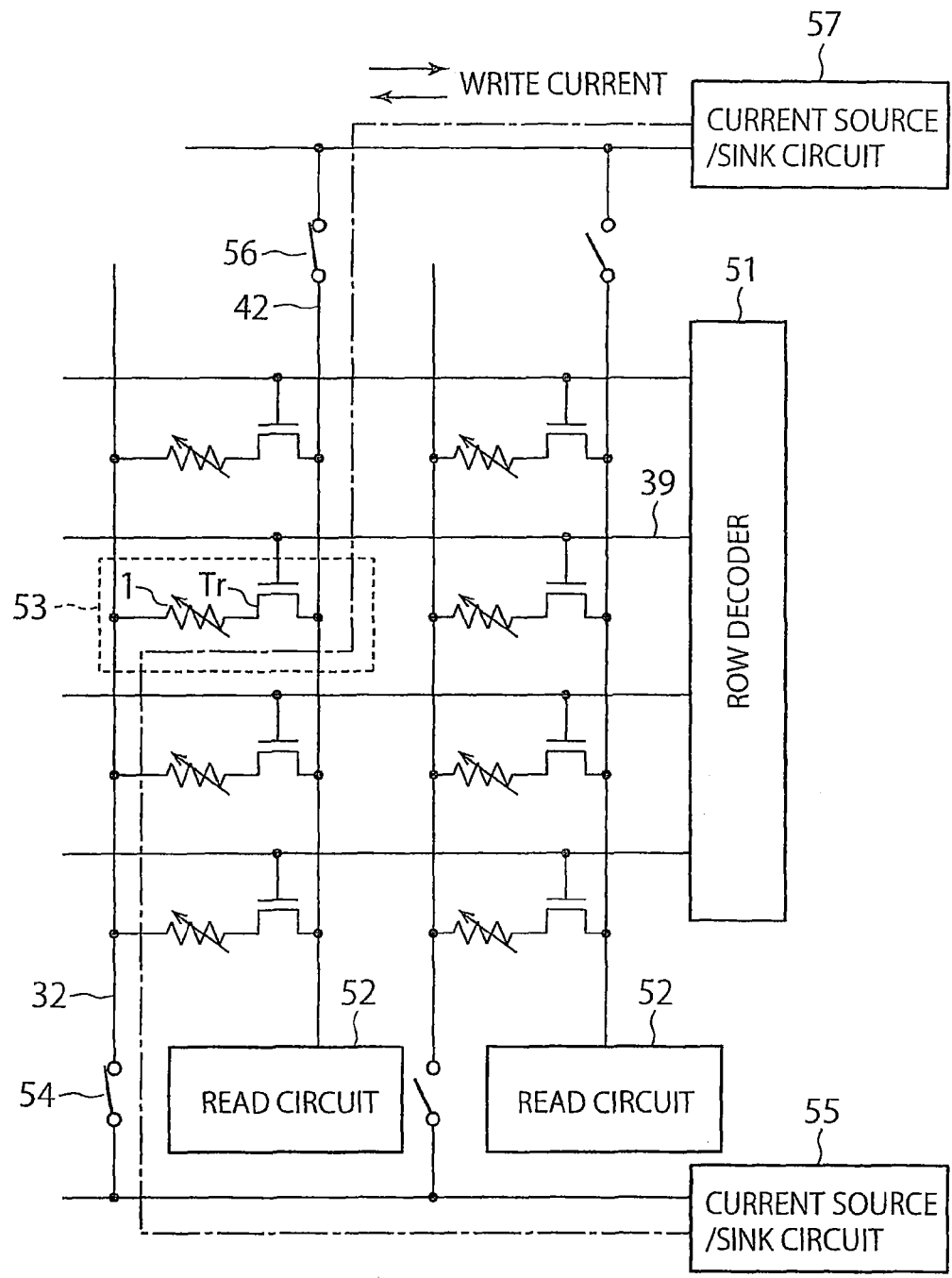
FIG. 14 is a circuit diagram of the main part of the magnetic memory according to the fifth embodiment.

In the MRAM according to this embodiment, a plurality of memory cells, each being the one shown in FIG. 13, are arranged in a matrix form, thereby forming a memory cell array of the MRAM. FIG. 14 is a circuit diagram showing the main part of the MRAM according to this embodiment.

FIG. 14 shows that a plurality of memory cells 53 each including an MTJ element 1 and a selection transistor Tr are arranged in a matrix form. One end of each of the memory cells 53 in the same column is connected to the same bit line 32, and the other is connected to the same bit line 42. The gate electrodes (word line) 39 of the selection transistors Tr of the memory cells 53 belonging to the same row are mutually connected, and further connected to a row decoder 51.

The bit line 32 is connected to a current source/sink circuit 55 via a switching circuit 54 such as a transistor. Furthermore, the bit line 42 is connected to a current source/sink circuit 57 via a switching circuit 56 such as a transistor. The current source/sink circuits 55 and 57 supply a write current to the bit lines 32 and 42 connected thereto, or sink a current from the bit lines 32 and 42 connected thereto.

The bit line 42 is also connected to a read circuit 52. The read circuit 52 can be connected to the bit line 32. The read circuit 52 includes a read current circuit, a sense amplifier, and the like.

In a write operation, by turning on the switching circuits 54 and 56 connected to a memory cell, on which the write operation is performed, and the selection transistor Tr, a current path passing through the target memory cell is formed. One of the current source/sink circuits 55 and 57 functions as a current source, and the other functions as a current sink depending on information to be written. As a result, a write current flows in a direction depending on the information to be written.

With respect to the write speed, it is possible to perform the spin transfer writing with a current having a pulse width from a few nanoseconds to a few microseconds.

In a read operation, a read current that is low enough to prevent magnetization switching is supplied to the MTJ element 1 specified in the same manner as the write operation. The read circuit 52 determines the resistance state of the MTJ element 1 by comparing a current value or voltage value, which is derived from the resistance value that depends on the magnetization state of the MTJ element 1, with a reference value.

Incidentally, it is preferable that the current pulse width in a read operation be narrower than that in a write operation. In this manner, the occurrences of writing errors caused by a current in a read operation can be reduced. This is based on the fact that the narrower the pulse width of a write current is, the higher the absolute value of the write current becomes.

As described above, according to this embodiment, it is possible to obtain a magnetic memory using a magnetoresistive element with a low saturation magnetization and a high perpendicular magnetic anisotropy energy.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
   a first magnetic layer;
   a second magnetic layer; and
   a first nonmagnetic layer provided between the first magnetic layer and the second magnetic layer,
   the first magnetic layer including a magnetic film of $Mn_xGe_y$, (77 atm %≤x≤82 atm %, 18 atm %≤y≤23 atm %, x+y=100 atm %).

2. The element according to claim 1, wherein when at least one element selected from the group consisting of Al, Si, B, C, P, Ti, Zn, Mg, Ca, Cr, and Ga is expressed as X, the magnetic film of the first magnetic layer contains $(Mn_xGe_y)_{100-z}X_z$ (77 atm %≤x≤82 atm %, 18 atm %≤y≤23 atm %, x+y=100 atm %, z≤10 atm %).

3. The element according to claim 1, wherein at least one of the first magnetic layer and the second magnetic layer has a single crystal structure.

4. The element according to claim 1, wherein a third magnetic layer is inserted between the first magnetic layer and the first nonmagnetic layer or between the second magnetic layer and the first nonmagnetic layer, or the third magnetic layer is inserted between the first magnetic layer and the first nonmagnetic layer and between the second magnetic layer and the first nonmagnetic layer.

5. The element according to claim 4, wherein the third magnetic layer contains at least one element selected from the group consisting of Mn, Al, and Ge.

6. The element according to claim 4, wherein the third magnetic layer contains at least one element selected from the group consisting of Co, Fe, and Ni.

7. The element according to claim 1, wherein the first nonmagnetic layer contains either an oxide containing at least one element selected from the group consisting of Mg, Ca, Ba, Al, Be, Sr, Zn, Ti, V, and Nb or an oxide containing at least one element selected from the group consisting of Sr, Ce, Dy, La, K, Ca, Na, Pb, and Ba and at least one element selected from the group consisting of Ti, V, Cr, Mn, Fe, Co, Ni, Ga, Nb, Mo, Ru, Ir, Ta, Ce, and Pb.

8. The element according to claim 1, wherein the first magnetic layer is formed on a base layer, the base layer being one layer selected from the group consisting of:
   a layer of nitride having a NaCl structure containing at least one element selected from the group consisting of Ti, Zr, Nb, V, Hf, Ta, Mo, W, B, Al, and Ce;
   a layer of oxide containing one element selected from the group consisting of Sr, Ce, Dy, La, K, Ca, Na, Pb, and Ba, and at least one element selected from the group consisting of Ti, V, Cr, Mn, Fe, Co, Ni, Ga, Nb, Mo, Ru, Ir, Ta, Ce, and Pb;
   a layer of oxide having a NaCl structure containing at least one element selected from the group consisting of Mg, Al, and Ce; and
   a layer containing at least one element selected from the group consisting of Al, Cr, Fe, Co, Rh, Pd, Ag, Ir, Pt, and Au, and having a (001) oriented tetragonal or cubic structure.

9. The element according to claim 1, wherein:
   each of the first and the second magnetic layers has an easy magnetization axis in a direction perpendicular to a film plane;
   when a write current is caused to flow between the first magnetic layer and the second magnetic layer via the first nonmagnetic layer, a direction of magnetization of the first magnetic layer is changeable, and a direction of magnetization of the second magnetic layer is fixed;
   the magnetoresistive element further includes a fourth magnetic layer located on a side of the second magnetic layer opposite from the first nonmagnetic layer, and having an easy magnetization axis in a direction perpendicular to the film plane, a direction of magnetization of the fourth magnetic layer being antiparallel with a direction of magnetization of the second magnetic layer;
   the magnetoresistive element further includes a second nonmagnetic layer located between the second magnetic layer and the fourth magnetic layer; and
   the magnetoresistive element meets a relationship represented by an expression $Ms_2 \times t_2 < Ms_4 \times t_4$, where a saturation magnetization of the second magnetic layer is $Ms_2$, a thickness of the second magnetic layer is $t_2$, a saturation magnetization of the fourth magnetic layer is $Ms_4$, and a thickness of the fourth magnetic layer is $t_4$.

10. A magnetic memory comprising:
    the magnetoresistive element according to claim 1;
    a first wiring electrically connecting to the first magnetic layer of the magnetoresistive element; and
    a second wiring electrically connecting to the second magnetic layer of the magnetoresistive element.

11. The memory according to claim 10, wherein when at least one element selected from the group consisting of Al, Si, B, C, P, Ti, Zn, Mg, Ca, Cr, and Ga is expressed as X, the magnetic film of the first magnetic layer contains $(Mn_xGe_y)_{100-z}X_z$ (77 atm %≤x≤82 atm %, 18 atm %≤y≤23 atm %, x+y=100 atm %, z≤10 atm %).

12. The memory according to claim 10, wherein at least one of the first magnetic layer and the second magnetic layer has a single crystal structure.

13. The memory according to claim 10, wherein a third magnetic layer is inserted between the first magnetic layer and the first nonmagnetic layer or between the second magnetic layer and the first nonmagnetic layer, or the third magnetic layer is inserted between the first magnetic layer and the first nonmagnetic layer and between the second magnetic layer and the first nonmagnetic layer.

14. The memory according to claim 13, wherein the third magnetic layer contains at least one element selected from the group consisting of Mn, Al, and Ge.

15. The memory according to claim 13, wherein the third magnetic layer contains at least one element selected from the group consisting of Co, Fe, and Ni.

16. The memory according to claim 10, wherein the first nonmagnetic layer contains either an oxide containing at least one element selected from the group consisting of Mg, Ca, Ba, Al, Be, Sr, Zn, Ti, V, and Nb or an oxide containing at least one element selected from the group consisting of Sr, Ce, Dy, La, K, Ca, Na, Pb, and Ba and at least one element selected from the group consisting of Ti, V, Cr, Mn, Fe, Co, Ni, Ga, Nb, Mo, Ru, Ir, Ta, Ce, and Pb.

17. The memory according to claim 10, wherein the first magnetic layer is formed on a base layer, the base layer being one layer selected from the group consisting of:

a layer of nitride having a NaCl structure containing at least one element selected from the group consisting of Ti, Zr, Nb, V, Hf, Ta, Mo, W, B, Al, and Ce;

a layer of oxide containing one element selected from the group consisting of Sr, Ce, Dy, La, K, Ca, Na, Pb, and Ba, and at least one element selected from the group consisting of Ti, V, Cr, Mn, Fe, Co, Ni, Ga, Nb, Mo, Ru, Ir, Ta, Ce, and Pb;

a layer of oxide having a NaCl structure containing at least one element selected from the group consisting of Mg, Al, and Ce; and a layer containing at least one element selected from the group consisting of Al, Cr, Fe, Co, Rh, Pd, Ag, Ir, Pt, and Au, and having a (001) oriented tetragonal or cubic structure.

18. The memory according to claim 10, wherein:

each of the first and the second magnetic layers has an easy magnetization axis in a direction perpendicular to a film plane;

when a write current is caused to flow between the first magnetic layer and the second magnetic layer via the first nonmagnetic layer, a direction of magnetization of the first magnetic layer is changeable, and a direction of magnetization of the second magnetic layer is fixed;

the magnetoresistive element further includes a fourth magnetic layer located on a side of the second magnetic layer opposite from the first nonmagnetic layer, and having an easy magnetization axis in a direction perpendicular to the film plane, a direction of magnetization of the fourth magnetic layer being antiparallel with a direction of magnetization of the second magnetic layer;

the magnetoresistive element further includes a second nonmagnetic layer located between the second magnetic layer and the fourth magnetic layer; and the magnetoresistive element meets a relationship represented by an expression $Ms_2 \times t_2 < Ms_4 \times t_4$, where a saturation magnetization of the second magnetic layer is $Ms_2$, a thickness of the second magnetic layer is $t_2$, a saturation magnetization of the fourth magnetic layer is $Ms_4$, and a thickness of the fourth magnetic layer is $t_4$.

* * * * *